United States Patent
Wang

(10) Patent No.: US 9,746,730 B2
(45) Date of Patent: Aug. 29, 2017

(54) ARRAY SUBSTRATE HAVING DATA LINE SELF-REPAIRING FUNCTION AND LIQUID CRYSTAL DEVICE

(71) Applicant: Shenzhen China Star Optoelectronics Technology Co., Ltd., Shenzhen, Guangdong (CN)

(72) Inventor: Meng Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 279 days.

(21) Appl. No.: 14/426,335

(22) PCT Filed: Dec. 30, 2014

(86) PCT No.: PCT/CN2014/095558
§ 371 (c)(1),
(2) Date: Mar. 5, 2015

(87) PCT Pub. No.: WO2016/101307
PCT Pub. Date: Jun. 30, 2016

(65) Prior Publication Data
US 2016/0342052 A1 Nov. 24, 2016

(30) Foreign Application Priority Data
Dec. 24, 2014 (CN) .......................... 2014 1 0818036

(51) Int. Cl.
G02F 1/1343 (2006.01)
G02F 1/1362 (2006.01)
G02F 1/1335 (2006.01)
G02F 1/1368 (2006.01)

(52) U.S. Cl.
CPC ...... *G02F 1/136259* (2013.01); *G02F 1/1362* (2013.01); *G02F 1/1368* (2013.01); *G02F 1/133514* (2013.01); *G02F 2001/136263* (2013.01); *G02F 2201/123* (2013.01); *H01L 2924/0002* (2013.01)

(58) Field of Classification Search
CPC ... G02F 2001/136263; G02F 1/133345; G02F 1/136259; G02F 1/136286
See application file for complete search history.

(56) References Cited

U.S. PATENT DOCUMENTS 4,853,755 A * 8/1989 Okabe .................. G02F 1/1368
257/530
7,903,189 B2 * 3/2011 Kang ................ G02F 1/136259
349/138

* cited by examiner

*Primary Examiner* — Paisley L Arendt
(74) *Attorney, Agent, or Firm* — Andrew C. Cheng

(57) ABSTRACT

An array substrate having a data line self-repairing function and a liquid crystal display device is disclosed. The array substrate comprises a plurality of pixel units, the pixel unit at least comprise a gate layer, a gate insulating layer, a data layer and a pixel electrode layer laminated therein. Every of the pixel unit have a translucent area and opening areas. The gate layer relative to the opening area is retained, and the gate insulating layer does not cover the gate layer, and the data layer relative to the opening area contacts with the gate layer so that a broken data line in the data layer has conductive connection through the gate layer. Through the above solution, the data line has automatic repair function for disconnection and the unqualified rate of the data line during the manufacture processes is reduced.

13 Claims, 4 Drawing Sheets

ARRAY SUBSTRATE HAVING DATA LINE SELF-REPAIRING FUNCTION AND LIQUID CRYSTAL DEVICE

FIELD OF THE INVENTION

The present invention relates to a display device technical field; in particular, to an array substrate having a data line self-repairing function and a liquid crystal device.

BACKGROUND OF THE INVENTION

Nowadays, a liquid crystal display device comprises a first substrate, a second substrate disposed relative to the first substrate, and a liquid crystal layer between the first substrate and the second substrate. A plurality of pixel units disposed at one side of the second substrate near the first substrate. The pixel units at least comprises a gate layer, a gate insulating layer, a data layer, a pixel electrode layer and a common electrode laminated therein, where an insulating layer is disposed between the pixel electrode layer and the common electrode layer. The gate layer and the data layer relative to the translucent in the pixel unit are etched. The gate layer and pixel electrode layer relative to the area between the two neighboring translucent areas are etched. The gate layer is used for disposing data line. A data layer is used for disposing the data line and comprises source traces and drain traces.

When manufacturing the second substrate, the broken line issue usually exists in the data line of the data layer on the second substrate. It results in the situation that the liquid crystal device after assembling has uneven color or obscure and the product yield is low.

SUMMARY OF THE INVENTION

The present invention provides an array substrate having a data line self-repairing function and a liquid crystal device thereby and it achieves the function of automatic self-repair for data lines and reduces the unqualified rate of the data line during the manufacture processes.

In order to achieve the above mentioned aims, the present invention the present invention adopts one solution which an array substrate having a data line self-repairing function, the array substrate comprises a plurality of pixel units, the pixel units at least comprises a gate layer, a gate insulating layer, a data layer and a pixel electrode layer laminated therein and a translucent area is disposed at each of the pixel units wherein a opening area is disposed at the pixel units; the array substrate relative to the translucent area does not cover the gate insulating layer; the gate layer relative to the opening area is retained, and the gate insulating layer does not cover the gate layer, and the gate insulating layer does not contact with the gate layer relative to the opening area, and the data layer relative to the opening area contacts with the gate layer, so that a disconnected data line in the data layer connects conductively with the gate layer.

Further, the opening area is disposed between the neighboring translucent areas.

Further, the pixel units is disposed at at least two opening area.

In order to achieve the above mentioned aims, the present invention adopts the other solution which An array substrate having a data line self-repairing function, the array substrate comprises a plurality of pixel units, the pixel units at least comprises a gate layer, a gate insulating layer, a data layer and a pixel electrode layer laminated therein and a translucent area is disposed at each of the pixel units wherein a opening area is disposed at the pixel units; the gate layer relative to the opening area is retained, and the gate insulating layer does not cover the gate layer, and the opening area relative to the data layer contacts with the gate layer, so that a disconnected data line in the data layer can have conductive connection through the gate layer.

Further, the gate insulating layer does not contact with the gate layer relative to the opening area.

Further, the translucent area relative to the array substrate is not cover by the gate insulating layer.

Further, the opening area is disposed between the neighboring translucent areas.

Further, the at least two opening area is disposed at each of the pixel units.

In order to achieve the above mentioned aims, the present invention adopts another solution which a liquid crystal display device having a data line self-repairing function, the liquid crystal display device comprises a first substrate, a second substrate, and a liquid crystal layer disposed between the first substrate and the second substrate, wherein the first substrate comprises a plurality of pixel units, the pixel units at least comprises a gate layer, a gate insulating layer, a data layer and a pixel electrode layer laminated therein and a translucent area is disposed at each of the pixel units wherein an opening area is disposed at the pixel units; the gate layer relative to the opening area is retained, and the gate insulating layer does not cover the gate layer, and the data layer relative to the opening area contacts with the gate layer, so that a disconnected data line in the data layer connects conductively with the gate layer.

Further, the gate insulating layer does not contact with the gate layer relative to the opening area.

Further, the translucent area relative to the array substrate does not cover the gate insulating layer.

Further, the opening area is disposed between the neighboring translucent areas.

The advantage of the present invention: comparing the conventional art, the present invention disposed an opening area in each of the pixel units and the data layer relative to the opening area contacts with the gate layer, and hence a broken data line can still be conductor through the gate layer so that the broken data line has automatic self-repairing function. The unqualified rate of the data line can be reduced during manufacture processes.

DETAILED DESCRIPTION OF THE PREFERRED EMBODIMENTS

The following description, for purposes of illustration and not of limitation, the system proposed structures, interfaces, specific details such as particular techniques and the like, so that a thorough understanding of the present application. However, the skilled person will appreciate that, in the absence of these specific details in other embodiments of the present invention may also be implemented. In other instances, detailed description is omitted for the well-known devices, circuits, and methods in order to avoid unnecessary detail hinder the description of the present invention.

The present invention provides an array substrate having a data line self-repairing function and a liquid crystal device which comprises a first substrate, a second substrate disposed relative to the first substrate, and a liquid crystal layer between the first substrate and the second substrate. The first substrate is an array substrate. The liquid crystal display device can be a liquid crystal display used in a TV or a computer. It also can be a small size liquid crystal display used in a phone or a portable mobile terminal.

Figure 1:
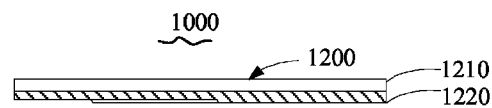
FIG. 1 is a schematic diagram of the embodiment of the liquid crystal display device of the present invention
Figure 1:
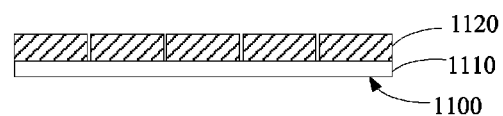
Figure 2:
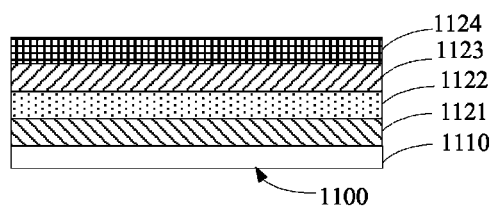
FIG. 2 is a schematic diagram of one embodiment of the array substrate of the present invention.
Figure 3:
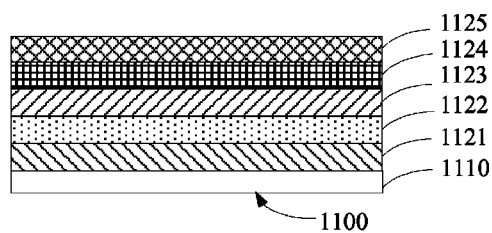
FIG. 3 is a schematic diagram of the other embodiment of the array substrate of the present invention.

Please refer to FIG. 1. FIG. 1 is the schematic diagram of the liquid crystal display device of the embodiment of the present invention. The liquid crystal device 100 comprises a first substrate 1100, a second substrate 1200 which is disposed relatively with the first substrate, and a liquid crystal layer (not shown in figures) being disposed between the first substrate 1100 and the second substrate 1200, where the first substrate 1100 is a TFT (Thin Film Transistor) substrate and the first substrate 1100 comprises a plurality of pixel units and a translucent area is disposed at each of the pixel units; and the second substrate 1200 is a CF (Color Filter) substrate. In the following, the one pixel unit in the first substrate as an example:

Please refer to FIG. 2 and FIG. 3. FIG. 2 is a schematic diagram of one embodiment of an array substrate of the present invention. FIG. 3 is a schematic diagram of another embodiment of an array substrate of the present invention.

As a preferred embodiment which the large size liquid crystal device is used for a television or a computer shown in FIG. 2, the first substrate 1100 at least comprises a first glass substrate 1110 and a plurality of pixel units 1120 where are disposed at one side of the first glass substrate 1110 near the one side of the second substrate 1200. Wherein, each of the pixel units 1120 at least comprises a gate layer 1121, a gate insulating layer 1122, a data layer 1123 and a pixel electrode layer 1124 laminated therein.

The second substrate 1200 at least comprises a second glass substrate 1210 and a common electrode 1220 where is disposed at the one side of the second glass substrate 1200 near the one side of the first substrate 1100.

As a preferred embodiment which the small size liquid crystal device is used for a cell phone or a portable mobile terminal, a common electrode is disposed at the first substrate 1100 and a common electrode in the second substrate 1200 can be indium tin oxide.

As shown in FIG. 3, the first substrate 1100 at least comprises a first glass substrate 1110 and a plurality of pixel units 1120 where are disposed at the first glass substrate 1110 near one side of the second substrate 1200. Each of the pixel units 1120 at least comprises a gate layer 1121, a gate insulating layer 1122, a data layer 1123, a pixel electrode layer 1124 and a common electrode layer 1125 laminated therein. The pixel electrode layer 1124 and the common electrode layer 1125 further have an insulating layer (not shown in figures).

Comparing with the conventional art, the pixel unit 1120 of the present invention further has an opening area 1400; the gate layer 1121 relative to the opening area 1400 is retained and the gate insulating layer 1122 does not cover the gate layer 1121, and the data layer 1122 relative to the opening area 1400 contacts with the gate layer 1121, so that a disconnected data line in the data layer can have an electrical connection through the gate layer 1121. Also, the opening area 1400 is an opening area in the gate insulating 1122.

Preferably, the gate insulating layer 1122 does not contact with the opening area 1400 relative to the gate layer 1121.

Preferably, the translucent area 1300 relative to the first glass substrate 1210 does not cover the gate insulating layer.

Preferably, the opening area is disposed between the two neighboring translucent areas 1300.

Specifically, when the first substrate of the large size liquid crystal display device 100 of the TV or computer is manufactured, the gate layer 1121 is disposed in the surface of the first glass substrate 1110 and the translucent area 1300 of the pixel unit is etched relative to the gate layer 1121.

Then, the gate insulating layer 1122 is disposed on the gate layer 1121 so that the gate insulating layer 1122 covers the gate layer 1121, where the gate insulating layer 1122 can contact with the gate layer 1121 relative to the opening area 1400, or it cannot contact with the gate layer 1121 relative to the opening area 1400.

After disposing the gate insulating layer, the gate insulating layer relative to the predetermined opening area 1122 is etched so that the gate insulating layer 1122 does not cover gate layer 1121 to form the opening area 1400 of the gate insulating layer.

Then, a data layer 1123 is disposed on the gate insulating layer so that the data layer 1123 covers the gate insulating layer 1122, and the data layer 1123 relative to the opening area 1400 contacts with the gate layer 1121, where the data layer 1123 relative to the translucent layer 1300 has to be etched.

After that, the pixel electrode layer 1124 is disposed on the data layer 1123 continuously so that the pixel electrode layer 1124 covers the data layer 1123, where the area between the two neighboring translucent areas 1300 of the pixel units 1121 has to be etched relative to the pixel electrode layer 1124, so that the area between the two neighboring translucent area 1300 of the neighboring pixel units 1121 and relative to the data layer 1123 is not covered by the pixel electrode layer 1124.

When a data line is broken in the data layer 1123, the data signal is transferred from one end of the broken data line to the data layer 1123 contacting with the gate layer 1121, through the gate layer 1121, finally to the other end of the broken data line, so that the disconnection of the data line can be conductive through the gate layer. The data lines can repair themselves so that the unqualified rate of the data line can be reduced.

Comparing the first substrate of the liquid crystal device 1000 for a cell phone or a portable mobile terminal with the first substrate 1100 of the liquid crystal display 1000 for TV or computer, after disposing the pixel electrode layer 1124, the common electrode 1125 is needed to be disposed on the pixel electrode layer 1124, so that the common electrode layer 1125 covers the pixel electrode layer 1124.

Where, the area between the translucent areas 1300 of the two neighboring pixel units 1121 is etched relative to the pixel electrode layer 1124, so that the area between the translucent areas 1300 of the two neighboring pixel units 1121 and relative to the data layer 1123 is not covered by the pixel electrode layer 1124.

It can be understood that the translucent area 1300 of each of the pixel unit 1120 can be identical or can be different.

The opening area 1400 of the present invention is disposed at the area between the translucent areas 1300 of the two neighboring pixel units 1121.

In other embodiments, the opening area 1400 is disposed in the other areas. The present invention is not limited herein.

The shape of the opening area 1400 can be square, or rectangle, but the present invention is not limited herein. The opening area 1400 can be other shape, and the present invention is not limited herein. The opening area 1400 relative to the data layer 1123 can only contact with the gate layer 1121. The amount the opening area 1300 can be one or be at least two.

Wherein, the larger area of the opening area 1400 is, the larger the contact area which the data layer 1123 can contact with the gate layer 1121 is, so that the contact area comprises more data lines and the data lines have stronger self-repair function. But the larger opening area 1400 is, the larger parasitic capacitance of the pixel unit 1120 is. The more serious signal delay of the data lines have to be repaired, the liquid crystal is charged more slowly. When the first substrate 1100 with a large parasitic capacitance is assembled into the liquid crystal display device, the liquid crystal display appears dim because the liquid crystal capacitance cannot be charged.

Preferably, the gate insulating layer 1122 relative to the translucent area 1300 of the pixel unit 1120 can be etched so that the light transmittance of the liquid crystal display device can be enhanced.

Figure 4:
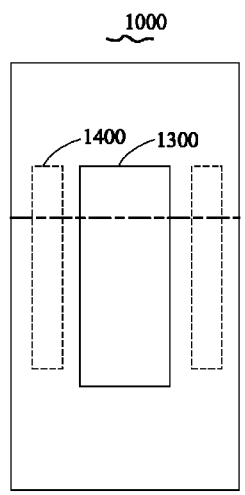
FIG. 4 is a top view of one embodiment of the pixel unit of the array substrate of the present invention
Figure 5:
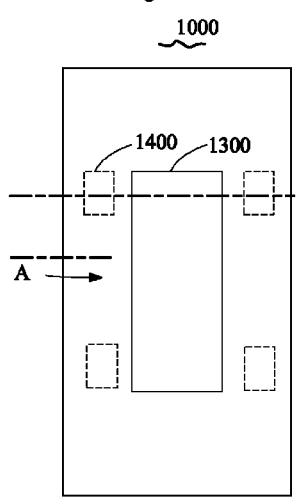
FIG. 5 is a top view of the other embodiment of the pixel unit of the array substrate of the present invention
Figure 6:
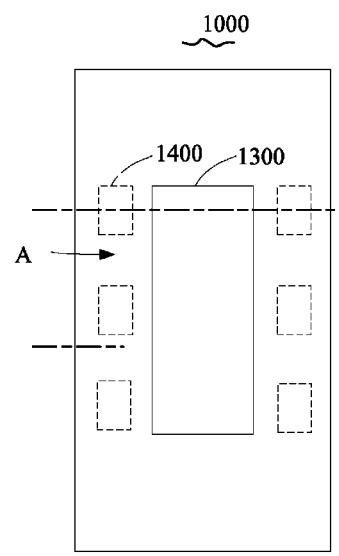
FIG. 6 is a top view of another embodiment of the pixel unit of the array substrate of the present invention

A top view of the pixel units of the first substrate 1100 after manufacturing is shown in FIG. 4 to FIG. 6. FIG. 4 is a top view of one embodiment of the pixel units of the array substrate of the present invention. FIG. 5 is a top view of the other embodiment of the pixel units of the array substrate of the present invention. FIG. 6 is a top view of another embodiment of the pixel units of the array substrate of the present invention.

In the following, the first substrate 1100 as shown in FIG. 3 shows a sectional diagram of the translucent area, the opening areas and A area between the neighboring opening areas.

Figure 7:
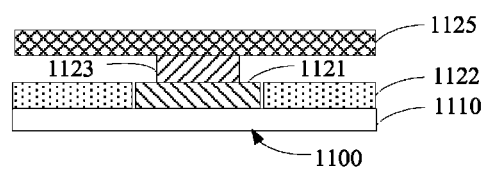
FIG. 7 is a sectional diagram of one embodiment of the opening area of the pixel unit of the present invention.
Figure 8:
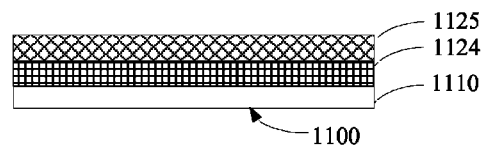
FIG. 8 is a sectional diagram of one embodiment of the translucent area of the pixel unit of the present invention.
Figure 9:
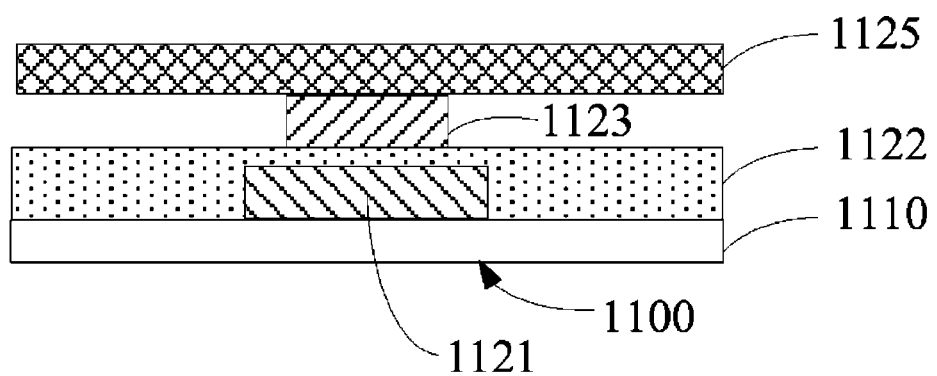
FIG. 9 is a sectional diagram of one embodiment of the A area in FIG. 7 and FIG. 8.

Please refer to FIG. 7 to FIG. 9. FIG. 7 is the sectional diagram of one embodiment of the opening of the pixel unit of the present invention; FIG. 8 is the sectional diagram of one embodiment of the translucent area of the pixel unit of the present invention; FIG. 9 is a sectional diagram of one embodiment of the A area of FIG. 7 and FIG. 8.

As shown in FIG. 4, a translucent area 1300 is disposed at the first substrate 1100 of each of the pixel units after finishing manufacturing, and an opening area 1400 is respectively disposed between the two neighboring translucent areas 1300. In the present embodiment, the opening areas 1400 can be rectangle and the length of the opening area 1400 is smaller than or equal to the length of one side of the translucent area 1400 near it. The width of the opening area 1400 is not smaller than the width of the data layer 1123 relative to the opening area 1400, but the present invention is not limited herein. The user can design the location and the size of the opening area 1400 based on the practical requirement.

The sectional diagram for the opening area 1400 is shown in FIG. 7. The gate layer 1121 relative to the opening area 1400 is retained and the gate insulating layer 1122 relative to the opening area 1400 does not cover the gate layer 1121 and the data layer 1123 relative to the opening area 1400 contacts with the gate layer 1122. The common electrode layer 1123 relative to the opening area 1400 covers the data layer 1123, where the insulating layer (not shown in figures) is disposed between the data layer 1123 and the common electrode layer 1125.

Because the opening area 1400 relative to the data layer 1123 contacts with the gate layer 1122, so that a broken data line still has an conductive connection through the data layer 1123. Hence, the broken data line has automatically self-repair function and the unqualified rate of the data line during manufacture process can be reduced.

The width of the opening area 1400 is the length of the gate insulating layer 1122 between the left and right sides of the gate layer 1121. The gate layer 1121 relative to the opening area 1400 where does not contact with the other area of the gate layer 1121 is independent. The gate layer 1121 relative to the opening area 1400 plays the role of the conductor. When a data line is broken in the data layer 1123, the signal transfers from one end of the broken line to the gate layer, and then to the other end of the broken line.

The gate insulating layer 1122 can contact with the gate layer 1121 relative to the opening area 1400, or it cannot contact with the gate layer 1121 relative to the opening area 1400, The sectional diagram of the translucent area 1300 is shown in FIG. 8. The first glass substrate 1110 relative to the translucent area 1300 does not cover the gate insulating layer 1122. The pixel electrode layer 1124 and the common electrode layer 1125 are disposed on the first glass substrate 1110, where an insulating layer (not shown in figures) is disposed between the first substrate 1110 and the pixel electrode layer 1124; an insulating layer (not shown in figures) is disposed between the pixel electrode layer 1124 and the common electrode 1125. It can be understood that the gate layer 1121, the gate insulating layer 1122 and the data layer 1123 relative to the translucent area 1300 of each of the pixel unit 1120 are all etched.

In the above mentioned solution, the opening area is disposed on the pixel unit of the first substrate, and the opening area relative to the data layer contacts with the gate layer, so a broken data line in the data layer can have conductive connection through the gate layer. Hence, the data line has automatic repair function and the unqualified rate of the data line during manufacture processes can be reduced. Also, the gate insulating layer of the translucent area is eliminated so the transmittance can be enhanced.

As shown in FIG. 5, in the other embodiment, a pixel unit 1120 has four opening areas which are respectively disposed between two neighbor translucent areas 1300. In the present embodiment, the opening area 1400 is rectangle. The sum of the length of the opening areas 1400 is smaller or equal to the length of the neighboring translucent area 1400 at the same side. The width of the opening area 1400 is not smaller than the width of the opening area 1400 relative to the data layer 1123, but the present invention is not limited herein. The user can design the location and the size of the opening area 1400 based on the practical use.

The sectional diagram of the opening area 1400 is shown in FIG. 7. The gate layer 1121 relative to the opening area 1400 is retained and the gate insulating layer 1122 relative to the opening area 1400 does not cover the gate layer 1121, and the data layer 1123 relative to the opening area 1400 contacts with the gate layer 1122. The common electrode layer 1125 relative to the opening area 1400 covers the data layer 1123 where an insulating layer (not shown in figures) is disposed between the data layer 1123 and the common electrode layer 1124. The width of the opening area 1400 is the length of the gate insulating layer 1122 at the right and left sides of the gate layer 1121.

Because the data layer 1123 relative to the opening area 1400 contacts with the gate layer 1122, so that a broken data line can have conductive connection through the gate layer 1122. The data line has automatic self-repairing function. The unqualified rate of the data line during manufacture process can be reduced.

The gate insulating layer 1122 can contact with the gate layer 1121 relative to the opening area 1400 or it also cannot contact with the gate layer.

The sectional diagram of the translucent area 1300 is shown in FIG. 8. The translucent area 1300 relative to the first glass substrate 1110 does not cover the gate insulating layer 1122. The pixel electrode layer 1124 and the common electrode layer 1125 are laminated on the first glass substrate 1110, where an insulating layer (not shown in figures) is disposed between the first glass substrate 1110 and the pixel electrode layer 1124; an insulating layer (not shown in figures) is disposed between the pixel electrode 1124 and the common electrode layer 1125. It can be understood that when manufacturing the first substrate 1110 in FIG. 3, the gate layer 1121, the gate insulating layer 1122 and the data layer 1123 relative to the translucent area 1300 of the pixel unit 1120 are all etched.

The sectional diagram of A area between the two neighboring opening area 1400 is shown in FIG. 9, the gate layer 1121 relative to the A area is retained and the gate insulating layer 1122 relative to the opening area 1400 covers the gate layer 1121. The data layer 1123 relative to the opening area 1400 does not contact with the gate layer 1122. The common electrode layer 1125 relative to the opening area 1400 covers the data layer 1123, where an insulating layer (not shown in figures) is disposed between the data layer 1123 and the common electrode layer 1125.

The width of the gate layer 1121 relative to the A area 1400 which is between the two neighboring opening areas 1400 is same as the opening area 1400 relative to the gate layer 1121. Moreover, the gate layer 1121 relative to the A area contacts with the gate layer 1121 relative to the opening area 1400, and the gate layer 1121 of the other area is independent. The A area and the gate layer 1121 relative to the opening area 1400 play the role of conductor, so that a broken data line in the data line 1123 can have conductive connection through the gate layer 1122.

When a data line is broken in the data layer 1123 relative to the opening area 1400, the broken data line can have conductive connection through the gate layer 1122 because the data line 1123 relative to the opening area 1400 connects with the gate layer 1122. The signal of the broken data line is transferred from the one end of the broken line to the gate layer 1121 relative to the opening area 1400, then transferring to the other end of the broken one. Hence, the data line can have self-repairing function to repair the broken data line automatically and the unqualified rate of the data line during manufacture process can be reduced.

When the data line is broken in the data line 1123 relative to the A area between the two neighboring opening areas 1400, the one end of the broken data line contacts with the gate layer 1121 relative to the opening areas 1400 which is near the broken line and the other end of the broken data line contacts with the gate layer 1121 relative to the other opening area 1400. The broken data line is still conductive through the two opening areas 1400 which are near by the broken data line. The signal transferring in the data line passes through the gate layer relative to one of the opening areas 1400 which is near by the end of the broken line and the gate layer 1121 relative to the A area, and then is transferred to the gate layer 1121 relative to the other opening area 1400 for transferring into the other end of the broken line. Hence, the data line can have self-repairing function to repair the broken data line automatically and the unqualified rate of the data line during manufacture process can be reduced.

In the above mentioned solution, the plurality of the opening areas are disposed on the pixel unit of the first substrate, and the opening area relative to the data layer contacts with the gate layer, so a broken data line in the data layer can be conductive through the gate layer. Hence, the data line has automatic repair function and the unqualified rate of the data line during manufacture processes can be reduced. Also, the gate insulating layer of the translucent area is eliminated so the transmittance can be enhanced.

As shown in FIG. 6, in the other embodiment, six opening areas are disposed in the pixel unit 1120 and uniformly between the two neighboring translucent area 1300. In this present embodiment, the opening areas 1400 are rectangle. The length sum of the opening area 1400 at one side is smaller or equal to the length of one side of the translucent area 1400 near the opening area. The width of the opening area 1400 is not smaller than the width of the data layer 1123 relative to the opening area 1400, but the present invention is not limited herein. The user can design the location and the size of the opening area 1400 based on the practical use.

The sectional diagram of the opening area 1400 is as shown in FIG. 7. The gate layer 1121 relative to the opening area 1400 is retained, and the gate insulating layer 1123 relative to the opening area 1400 contacts with the gate layer 1122. The data layer 1123 relative to the opening area 1400 contacts with the gate layer 1122. The common electrode layer 1125 relative to the opening area 1400 covers the data layer 1123, where an insulating layer (not shown in figures) is disposed between the data layer 1123 and the common electrode layer 1125. The width of the opening area 1400 is the length of the gate layer between the two side gate insulating layers.

The gate insulating layer 1122 can contact with the gate layer 1121 relative to the opening area 1400, or it cannot contact with the gate layer 1121 relative to the opening area 1400.

The sectional diagram of the translucent area 1300 is shown in FIG. 8. The first glass substrate 1110 relative to the translucent area 1300 is not cover by the gate insulating layer 1122. A pixel electrode layer 1124 and a common electrode layer 1125 are laminated on the first glass substrate 1110, where an insulating layer (not shown in figures) is disposed between the first glass substrate 1110 and the pixel electrode layer 1124, and an insulating layer (not shown in figures) is not disposed between the pixel electrode layer and the common electrode layer. It can be understood that the gate layer 1121, the gate insulating layer 1122 and the data layer 1123 relative to the translucent area 1300 of the pixel unit 1120 are all etched.

The sectional diagram of the A area between the two arbitrary neighboring opening areas 1400 is shown in FIG. 9. The gate layer 1121 relative to the A area is retained and the gate insulating layer 1122 relative to the opening area 1400 covers the gate layer 1121, and the data layer 1123 relative to the opening area 1400 does not contact with the gate layer 1122. The common electrode layer 1125 relative to the opening area 1400 covers the data layer 1123, where an insulating layer (not shown in figures) is disposed between the data layer 1123 and the common electrode layer 1125.

The width of the gate layer 1121 relative to the A area 1400 between the two arbitrary neighboring opening areas 1400 is same as the width of the gate layer 1121 relative to the opening area 1400 and is not smaller than the length of the data layer 1123 relative to the opening area 1400. Moreover, the gate layer 1121 relative to the A area contacts with the gate layer 1121 relative to the opening area 1400, but is independent relative to the other area of the gate layers 1121. The A area and the gate layer 1121 relative to the opening area 1400 play the role of conductor so the broken data line in the data layer 1123 can have conductive connection through the gate layer 1122.

When a data line is broken in the data layer 1123 relative to the opening area 1400, the broken data line can have conductive connection through the gate layer 1122 because the data line 1123 relative to the opening area 1400 connects with the gate layer 1122. The signal of the broken data line is transferred from the one end of the broken line to the gate layer 1121 relative to the opening area 1400, then transferring to the other end of the broken one. Hence, the data line can repair the broken data line automatically and the unqualified rate of the data line during manufacture process can be reduced.

When the data line is broken in the data line 1123 relative to the A area between the two arbitrary neighboring opening areas 1400, the one end of the broken data line contacts with the gate layer 1121 relative to the opening areas 1400 which are near by the broken line, and the other end of the broken data line contacts with the gate layer 1121 relative to the other opening area 1400. The broken data line still has conductive connection through the two opening areas 1400 which are near the broken data line. The signal transferring in the data line passes through the gate layer relative to one of the opening areas 1400 which is near the end of the broken line and the gate layer 1121 relative to the A area, and then is transferred to the gate layer 1121 relative to the other opening area 1400 for transferring into the other end of the broken line. Hence, the data line can repair the broken data line automatically and the unqualified rate of the data line during manufacture processes can be reduced.

It can be understood that the pixel electrode layer 1125 and an insulating layer (not shown in figures) between the data layer 1123 and the pixel electrode layer 1125 are removed based on FIG. 7 to FIG. 9. Then, the sectional diagram showing the translucent area, the opening areas and the A area between the two neighboring opening areas relative to the first substrate 1100 can be acquired as shown in FIG. 2. The work principle of a data line is broken in the data line 1123 is same as one of the above mentioned embodiment. It does not repeat again.

In the above mentioned solution, the plurality of the opening areas are disposed on the pixel unit of the first substrate, and the opening area relative to the data layer contacts with the gate layer, so a broken data line in the data layer can be conductive through the gate layer. Hence, the data line has automatic repair function and the unqualified rate of the data line during manufacture process can be reduced. Also, the gate insulating layer of the translucent area is eliminated so the transmittance can be enhanced.

It can be understood that the amount of the opening area of the pixel units is not limited in two, four or six. It can set another values based on the practical use. The work principle is similar to the other embodiments of the present invention. According to the actual situation, the relevant content can be referred specifically. It does not repeat again.

In the embodiment of the few pixel units provided by the present invention, the opening area in FIG. 4 is larger than the opening area in FIG. 5 and FIG. 6. The data line self-repairing ability of the pixel units in FIG. 4 is larger than the data line self-repairing ability of the pixel units in FIG. 5 and FIG. 6, but the parasitic capacitance of the pixel units in FIG. 4 is larger than the parasitic capacitance of the pixel units in FIG. 5 and FIG. 6 which the signal delay situation of the signal transferred in data line is more serious. Parasitic capacitance is formed from the data layer relative to the non-opening area and other layers (such as ITO layer)

The charged voltage of the liquid crystal capacitance relative to the pixel unit with the larger parasitic capacitance deviates farther from the rated voltage and then the liquid crystal display device is dim because it cannot charge up to the rated voltage. The pixel units with the larger delayed signal have the weaker charging ability, such as the slower charging velocity and the longer charging time.

Where, the opening area 1400 is larger and the contacting area which the data layer 1123 contacts with the gate layer 1121 is larger so that the contacting area comprises more data lines and the self-repairing function of the data line is more strong. But the opening area 1400 is larger, the parasitic capacitance of the pixel unit 1120 is larger and the delay of the signal transferred in data line is more serious, but the liquid crystal capacitance charges slower. When the first substrate with the high parasitic capacitance is assembled into a liquid crystal display device, the liquid crystal device becomes dim because the liquid crystal cannot charge to the rated voltage.

In the some embodiments disclosed by the present invention, the improvement focuses on the gate layer and the gate insulating layer. The opening area is disposed at the gate insulating layer and the gate layer relative to the opening area is retained. The gate insulating layer does not cover the gate layer, but the data layer relative to the opening area contacts with the gate layer so that the data line has automatic self-repairing function and the unqualified rate of the data line during manufacture processes can be reduced. Also, the gate insulating layer of the translucent area is eliminated so the transmittance can be enhanced.

It can be understood that when the laminated structures of the other array substrates different from the laminated structure in FIG. 2 and FIG. 3 of the present invention, they could improve the gate layer and the gate insulating layer on the original laminated foundation by the method referring from the solution disclosed by the present invention to achieve the function of automatic self-repairing for data lines and reduce the unqualified rate of the data line during the manufacture processes The technical effect of transmittance is improved. The specific embodiment can refer the relative description. It does not repeat here.

The above description, for purposes of illustration and not of limitation, the system proposed structures, interfaces, specific details such as particular techniques and the like, so that a thorough understanding of the present application. However, the skilled person will appreciate that, in the absence of these specific details in other embodiments of the present invention may also be implemented. In other instances, detailed description is omitted for the well-known devices, circuits, and methods in order to avoid unnecessary detail hinder the description of the present invention.

What is claimed is:

1. An array substrate having a data line self-repairing function, wherein the array substrate comprises a plurality of pixel units, the pixel units at least comprise a gate layer, a gate insulating layer, a data layer and a pixel electrode layer laminated therein and a translucent area is disposed at each of the pixel units wherein an opening area is disposed at the pixel units;

the array substrate relative to the translucent area is not covered by the gate insulating layer;

the gate layer relative to the opening area is retained, and the gate insulating layer does not cover the gate layer, and the gate insulating layer does not contact with the gate layer relative to the opening area, and the data layer relative to the opening area contacts with the gate layer, so that a data line with two parts electrically disconnected in the data layer has conductive connection between the two parts through the gate layer.

2. The array substrate as claimed in claim 1, wherein the opening area is disposed between neighboring translucent areas.

3. The array substrate as claimed in claim 2, wherein at least two opening areas are disposed at the pixel units.

4. An array substrate having a data line self-repairing function, the array substrate comprises a plurality of pixel units, the pixel units at least comprises a gate layer, a gate insulating layer, a data layer and a pixel electrode layer laminated therein and a translucent area is disposed at each of the pixel units wherein an opening area is disposed at the pixel units;

the gate layer relative to the opening area is retained, and the gate insulating layer does not cover the gate layer, and the data layer relative to the opening area contacts with the gate layer, so that a data line with two parts electrically disconnected in the data layer has conductive connection between the two parts through the gate layer.

5. The substrate array as claimed in claim 4, wherein the gate insulating layer does not contact with the gate layer relative to the opening area.

6. The substrate array as claimed in claim 4, wherein the array substrate relative to the translucent area is not covered by the gate insulating layer.

7. The substrate array as claimed in claim 4, wherein the opening area is disposed between neighboring translucent areas.

8. The substrate array as claimed in claim 7, wherein at least two opening areas are disposed at each of the pixel units.

9. A liquid crystal display device having a data line self-repairing function, wherein the liquid crystal display device comprises a first substrate, a second substrate, and a liquid crystal layer disposed between the first substrate and the second substrate, wherein the first substrate comprises a plurality of pixel units, the pixel units at least comprise a gate layer, a gate insulating layer, a data layer and a pixel electrode layer laminated therein and a translucent area is disposed at each of the pixel units wherein an opening area is disposed at the pixel units;

the gate layer relative to the opening area is retained, and the gate insulating layer does not cover the gate layer, and the data layer relative to the opening area contacts with the gate layer, so that a data line with two parts electrically disconnected in the data layer has conductive connection between the two parts through the gate layer.

10. The liquid crystal display device as claimed in claim 9, wherein the gate insulating layer does not contact with the gate layer relative to the opening area.

11. The liquid crystal display device as claimed in claim 9, wherein the array substrate relative to the translucent area is not covered by the gate insulating layer.

12. The liquid crystal display device as claimed in claim 9, wherein the opening area is disposed between neighboring translucent areas.

13. The liquid crystal display device as claimed in claim 12, wherein at least two opening areas are disposed at the pixel units.

* * * * *